United States Patent [19]

Okuyama et al.

[11] 4,255,210

[45] Mar. 10, 1981

[54] METHOD FOR MANUFACTURING A READ-ONLY MEMORY DEVICE

[75] Inventors: Yasushi Okuyama; Tsuyoshi Suzuki, both of Kumamoto, Japan

[73] Assignee: Nippon Electric Co., Ltd., Tokyo, Japan

[21] Appl. No.: 19,293

[22] Filed: Mar. 12, 1979

[30] Foreign Application Priority Data

Mar. 14, 1978 [JP] Japan ................... 53-29616

[51] Int. Cl.³ ............................................. H01L 21/22
[52] U.S. Cl. ..................................... 148/187; 148/188
[58] Field of Search ...................... 148/187, 186, 188

[56] References Cited

U.S. PATENT DOCUMENTS

| | | | |
|---|---|---|---|
| 3,576,478 | 4/1971 | Watkins | 148/175 X |
| 3,756,876 | 9/1973 | Brown et al. | 148/187 X |
| 3,914,855 | 10/1975 | Cheney et al. | 148/187 |
| 4,067,099 | 1/1978 | Ito et al. | 148/187 |

OTHER PUBLICATIONS

Kawagoe et al., IEEE J. of Solid-State Circuits, vol. SC-11, No. 3, Jun. 1976, pp. 360-364.

*Primary Examiner*—G. Ozaki
*Attorney, Agent, or Firm*—Laff, Whitesel & Rockman

[57] ABSTRACT

A read only-memory (ROM) is manufactured by a process which produces memories having customized codes from partially completed semiconductor chips. The chips are manufactured to a step where a matrix of apertures or windows are formed in an oxide layer at every cross point of every potential code. Then, a silicon dioxide film is formed over the entire surface of the chip including the window apertures. At this stage, the chip is stored as a general purpose stock item. When an order is received to prepare a ROM chip with customized codes, a mask is formed to etch and reopen the apertures or windows in the dioxide film at the encoded cross points. Then, suitable contact material is deposited over the surface of the chip, thereby completing a contact at each of the reopened apertures or windows. As a result, the normal lead time required for a manufacturer to make a customized ROM is reduced from, say, 4.5 to 6 days to a period of approximately 1.5 to 2 days.

5 Claims, 13 Drawing Figures

ROM CODE START

ROM CODE START

METHOD FOR MANUFACTURING A READ-ONLY MEMORY DEVICE

BACKGROUND OF THE INVENTION

The present invention relates to a read-only memory (hereinafter called an ROM) and a method for manufacturing the same, and more particularly to a highly reliable ROM which can be quickly put into production, as in response to an order code from a customer, for example, and to a method for producing such ROM's.

As component elements of a ROM matrix, resistors, capacitors, diodes and the like are available. In the early digital computer age, an ROM employing simple diodes has been used. However, at present, it is a common practice to employ MOS type field-effect transistors. As micro computers have become more popular, an ROM forming one of its component elements has come to use a great number of codes.

Except for a programmable ROM (PROM) which can be electrically written and can be erased either electrically or by ultra-violet irradiation, general ROM's are called a mask ROM. In these mask ROM's, a selection of codes is achieved during manufacture either by selecting existing or non-existing MOS gates as memory cells transistors forming the ROM matrix or by selecting existing or non-existing contacts of the ROM. During manufacture, the selection is made by means of either a mask for the gates or a mask for the contacts.

However, in order to shorten the production period beginning with the reception of an order for ROM codes and ending with the delivery of products, it is a common practice to actually select the code at the manufacturing step of a process, which step is nearest to the completion in products. At present, the selection is generally achieved by making a combination of contacts.

Such a ROM comprises, for example, source regions extending in one direction along one major surface of a semiconductor substrate of one conductivity type. The source region has an opposite conductivity type. A plurality of drain regions are disposed, at predetermied intervals on both sides of the respective source regions. Gate electrodes consist of polycrystalline silicon and extend in the one direction over the one major surface and between the source and drain regions, via a gate insulator film. The gate electrode serves as a word line. A plurality of digit lines consist of, for instance, aluminum and extend in a direction at right angles to the one direction, over the gate electrodes and one major surface, via an insulating film, and among the drain regions arranged in a matrix pattern and digit wires. The digit lines are selected according to a code designation and are electrically connected through respective apertures in the insulating film.

In the above-described prior art ROM structure the code selection is made by means of a contact mask. The portion of the insulating film contacting an aluminum wiring is normally made of phosphorous glass. However, such phosphorous glass is subjected to the following reaction when there is a minute amount of water:

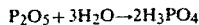

$$P_2O_5 + 3H_2O \rightarrow 2H_3PO_4$$

resulting in a production of phosphoric acid, which causes a deterioration of the aluminum wiring, and so, this structure has very poor humidity resistance.

As one solution for this problem, a vapor-grown silicon oxide film (of 0.1–1.0μ thickness) is formed between the phosphorous glass and the aluminum wiring. This silicon oxide film is made denser through a heat treatment. The phosphorous glass layer is prevented from directly contacting the aluminum wiring. However, the insulating layer consisting of the phosphorous glass film and the silicon oxide film becomes thick at the contact portion. Therefore, new disadvantages arise such that the contact aperture etching becomes difficult and the aluminum wiring is opt to break at the contact portion.

In order to overcome the new disadvantages, the apertures for making the contacts have been formed by means of the same contact mask before and after the formation of the vapor-grown silicon oxide film. According to this method, upon the first formation of the apertures for contacts in the phosphorous glass film or the thermal oxidation film, the contact apertures are formed in a tapered form. Hence, after the vapor-grown silicon oxide film has been laid down, the step of the oxide film at the contact aperatures becomes small, that is, steep steps of the oxide film are reduced in number. An advantage is obtained in that there are fewer breaks of the aluminum wiring at the contact portions. On the other hand, there is a disadvantage since the process is very time-consuming because it includes the steps of forming contact apertures, forming a vapor-grown silicon oxide film and forming contact apertures. Thus, there is a long lead time between the delivery of the product and the reception of an order of ROM codes.

SUMMARY OF THE INVENTION

It is one object of the present invention to provide a novel structure of a ROM and a method for manufacturing the same which effectively eliminate the aforementioned disadvantages in the prior art.

According to one feature of the present invention, a ROM comprising a plurality of ROM cells are formed as a matrix in a semiconductor substrate. Each ROM cell includes an impurity region formed in the substrate, a first insulating film, such as, for example, a thermal oxidation film having a phosphorous glass at its surface, or a phosphorous glass film, formed on the impurity region, a second insulating film such as, for example, a vapor-grown oxide film and formed on the first insulating film, a conductive layer such as, for example, an aluminum layer formed on the second insulating film. The ROM is characterized in that a plurality of apertures reaching the major surface of the impurity regions of the plurality of ROM cells are provided in the first insulating film. Among the plurality of apertures, a group of apertures are filled with the second insulating film while the remaining group of apertures among the plurality of apertures are filled with a conductive layer, such as aluminum, forming the digit line and making contact with the impurity regions.

According to another feature of the present invention, an ROM comprises source regions extending in one direction in parallel to each other along one major surface of a semiconductor substrate of one conductivity type. The source region have the opposite conductivity type. Drain regions of the opposite conductivity type are disposed on one side or on both sides of the respective source regions along the one major surface as arrayed in one direction. Word lines made of, for example, polycrystalline siicon, are provided over the one major surface between the drain and source regions via a gate insulator film and extending in the one direction. Digit lines made of, for example, aluminum or like metal are provided on the insulating layer above the word lines and on the insulating layer above, the one major surface and extending in a direction at right angles to the one direction. Means are provided for electrically connecting a selected group of drain regions formed in a matrix shape to digit lines on the respective drain regions. The insulating layer on the drain region is composed of a first insulating film consisting of, for example, a thermal oxidation film forming a phosphorus glass at its surface or a phosphorus glass film and a second insulating film consisting of, for examle, vapor-growth oxide film. Apertures reach the one major surface in the first insulating film on substantially all the drain regions in a matrix shape. The apertures on a group of drain regions, among the matrix-shaped drain regions are filled with the second insulating films. The apertures on the remaining group of drain regions are filled with conductor layers for connecting to the digit lines. In addition, the conductor layer is made of, for example, aluminum, and it is extended from the digit line.

According to another aspect of the present invention, a method for manufacturing a ROM comprise the steps of: providing first contact apertures through an insulating film on all memory cells formed in a semiconductor substrate by means of a first mask, forming a vapor-grown silicon oxide film over an entire upper surface of said substrate to cover the first contact apertures, optionally applying heat treatment to the substrate for making the vapor-grown silicon oxide film denser, and selectively providing second contact apertures through the vapor-grown silicon oxide film formed within desired first contact apertures such as, for example, contact apertures designated by desired codes among the first contact apertures by means of a second contact mask.

BRIEF DESCRIPTION OF THE DRAWINGS

Above-mentioned and other features and objects of the present invention will become more apparent by reference to the following description taken in conjunction with the accompanying drawings, wherein:

FIGS. 1A and 1B show one of the ROM's in the prior art. Along one major surface 17 of a p-type semiconductor substrate 10 having an impurity concentration of approximately $1 \times 10^{14}$ to $1 \times 10^{16}$ atoms/cm$^3$, there are provided a plurality of n-type source regions 18, shown with single-cross hatching in FIG. 1A. These regions have a surface impurity concentration of approximately $5 \times 10^{18}$ to $1 \times 10^{21}$ atoms/cm$^3$ and are connected to a ground line via common source regions 18', shown with single-cross hatching in FIG. 1A, which extend in one direction. On both sides of the respective source regions 18, 18' are arrayed a plurality of n-type drain regions 12, shown with single-cross hatching in FIG. 1A, having an impurity concentration of $5 \times 10^{18}$ to $1 \times 10^{21}$ atoms/cm$^3$ and spaced apart by channel regions 20 therebetween. These regions 12, 18 and 18' are surrounded by a thick field insulator 15 of 1.2 $\mu$m thickness. There are polycrystalline silicon layers 13, shown with stippling, having an impurity doping at a concentration of approximately $10^{15}$ to $10^{21}$ atoms/cm$^3$ and extending in the same direction as the source regions over gate insulator films 19 and the thick field insulator 15, to serve as word lines. In addition, a plurality of aluminum wiring layers 14 serving as digit lines extend in a direction at right angles to the direction of the source regions.

Figure 2:
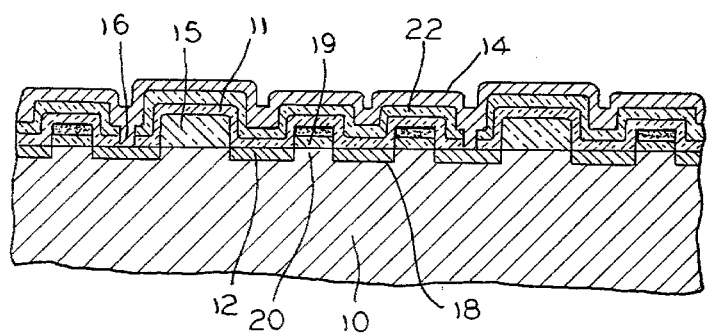
FIG. 2 is a cross sectional view showing different ROM cells in the prior art.

Then, one memory cell is composed of one drain region 12, a portion of a source region 18 located adjacent to the drain region 12 and separated by a channel region 20, a gate insulator film 19 over this channel region 20 and a portion of a polycrystalline silicon film 13 on the gate insulator film. Apertures 16 are provided through the insulating film 11 on a group of drain regions selected according to code designation among the drain regions 12 which are formed in a matrix. At these apertures, the selected drain regions are connected to the aluminum layer 14 thereon, while no connection is made to the remaining group of drain regions 12. In this construction, since phosphorus glass is used as the insulating film 11, the aluminum wiring layer 14 deteriorates, as described above. Accordingly, it might seem that an answer is to provide a silicon oxide film 22 of, for example, 5000 Å in thickness prepared through a CVD (Chemical Vapor Deposition) process between the aluminum wiring 14 and the insulating film 11, consisting of phosphorus glass, as shown in FIG. 2. However, with such a layer structure, contact etching becomes difficult and the aluminum wiring 14 is liable to break at the aperture.

DESCRIPTION OF THE PREFERRED EMBODIMENTS

Figure 3:
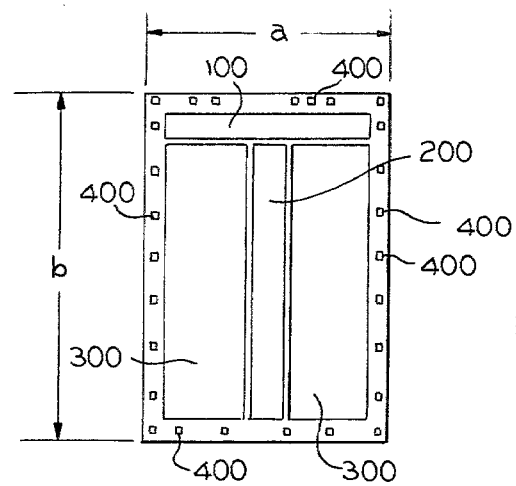
FIG. 3 is a plan view showing an outline of an entire ROM made of a semiconductor chip.
Figure 4A:
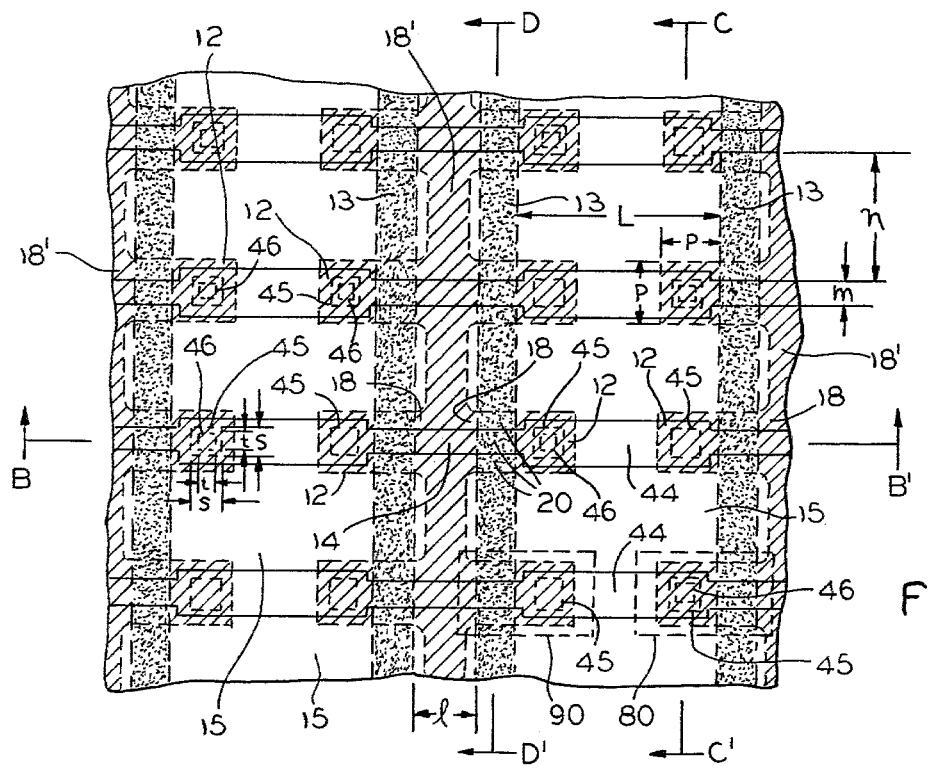
FIG. 4A is a plan view showing ROM cells in one preferred embodiment of the present invention.
Figure 4B:
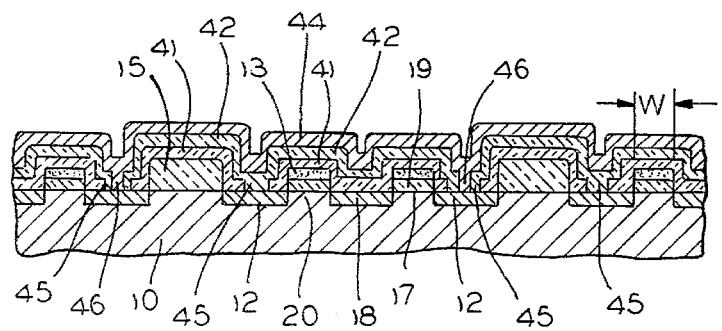
FIG. 4B is a cross-sectional view taken along line B-B' in FIG. 4A as viewed in the direction of arrows.
Figure 4C:
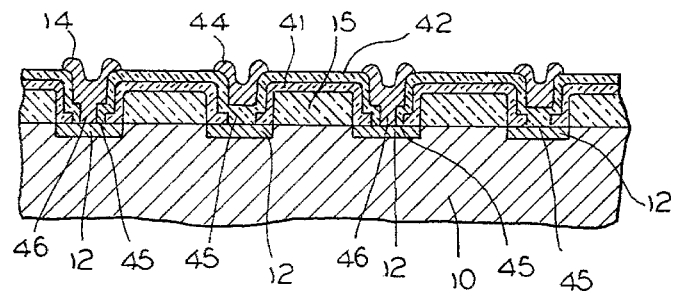
FIG. 4C is a cross-sectional view taken along line C-C' in FIG. 4A as viewed in the direction of arrows.
Figure 4D:
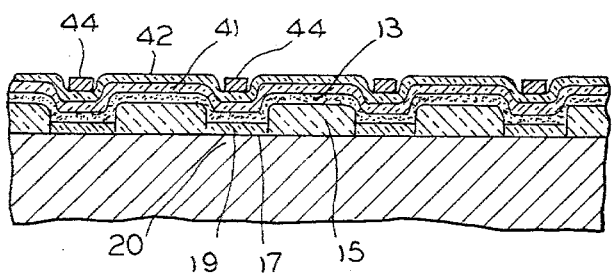
FIG. 4D is a cross-sectional view taken along line D-D' in FIG. 4A as viewed in the direction of arrows.

FIG. 3 is a schematic plan view showing an entire ROM according to one preferred embodiment of the present invention. An X-decoder section 100 and a Y-decoder section 200 are provided. On the two respective sides of the Y-decoder section 200 are disposed ROM cell sections 300, in which ROM cells are arrayed in a matrix shape. The configuration a$\times$b of the illustrated chip is 4.8 mm$\times$6.8 mm, and along the peripheral portion of the chip is disposed external terminals 400. A part of the ROM cell section 300 in FIG. 3 is illustrated in an enlarged scale in FIGS. 4A, 4B, 4C and 4D, in which component parts equivalent to those shown in FIG. 1 are designated by like reference numerals.

Figure 1A:
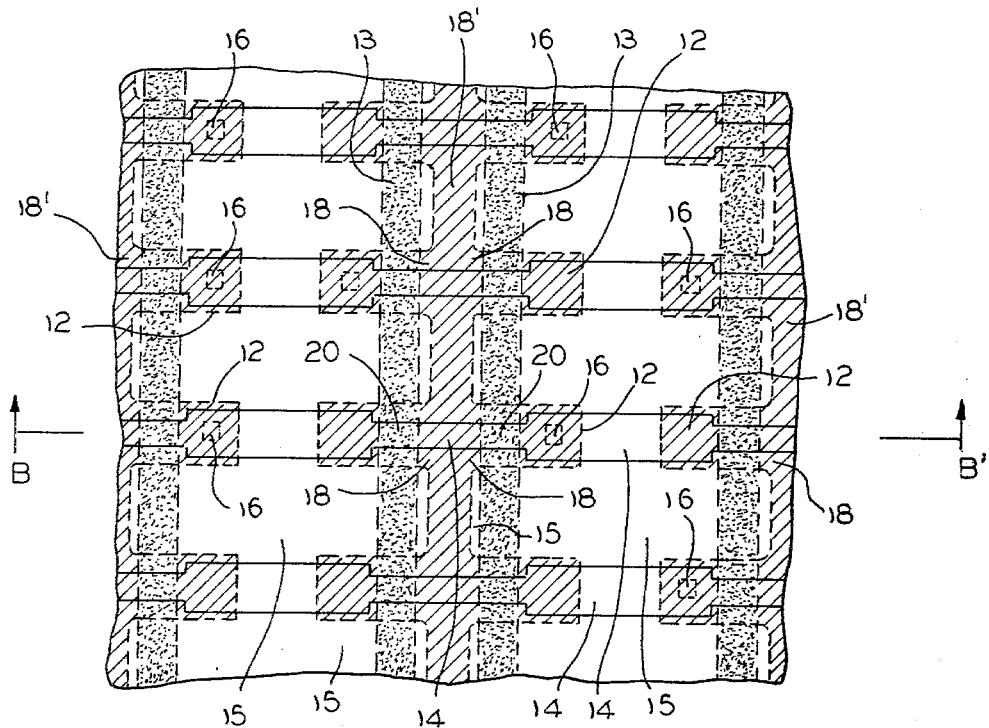
FIG. 1A is a plan view showing ROM cells in the prior art.
Figure 1B:
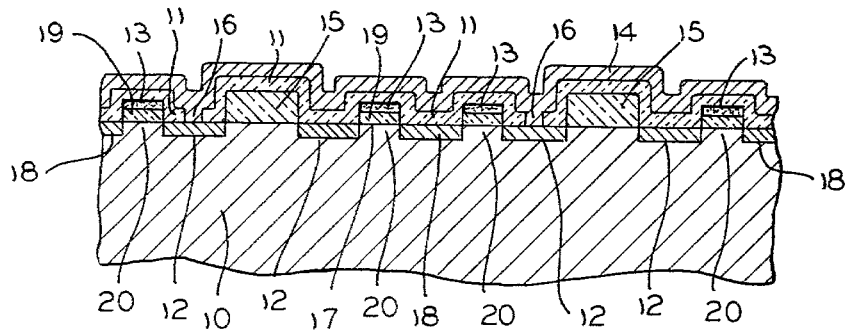
FIG. 1B is a cross sectional view taken alone line B-B' in FIG. 1A as viewed in the direction of arrows.

According to this preferred embodiment, n-type drain, source and common source regions 12, 18 and 18' having a depth $x_j$ of 0.5 to $1.5\mu$ as measured from one major surface 17 are provided in a p-type silicon substrate having a (511) crystal face and are surrounded by a thick field oxide 15 similar to FIG. 1. A width W of a polycrystalline wiring layer 13 on a gate insulator film 19 is $5\mu$. A length l, between source regions 18, and intervening substrate and oxide material, the length l being $8\mu$. A distance L, between polycrystalline wiring layers 13 associated with different drain regions, is $20\mu$. On the other hand, a width m of an aluminum wiring layer 44 is $4\mu$; a distance n between the aluminum wiring layers 44 is $10\mu$; and drain dimensions P are $7.5\mu$.

In the illustrated embodiment, first contact apertures 45 having a plan configuration $S\times S$ of $4\mu\times 4\mu$ are provided in a first insulating film 41 on all the drain regions arrayed in a matrix shape. Then a CVD silicon oxide film 42 of 5000 Å thickness, serving as a second insulating film, is deposited on the first insulating film 41 and within the first contact aperture 45. Second contact apertures 46 having a plan configuration $t\times t$ of $3.8\mu$ are provided in the silicon oxide film 42 within a group of first contact apertures 45 designated by ROM codes. Then the aluminum wirings 44 are provided. Accordingly, in a group of ROM memory calls 80 (the portion encircled by a dotted line), a second contact aperture 46 is provided within a first contact aperture 45 and an aluminum wiring is connected to a drain region through this second contact aperture 46. In the other group of ROM memory cells 90 (the portion encircled by a dotted line), the interior of the first contact aperture 45 is filled with a CVD silicon oxide film, so that the aluminum wiring 44 is not connected to the drain region 12 in this memory cell 90.

In this embodiment, a current in the order of 0.5 mA can be obtained in the ROM memory cell 80 through the wiring layer 44, the contact aperture 46, the drain region 12, the channel region 20, the source region 18, the common source region 18' and ground line, when the common source region 18' is connected to the ground line. The aluminum wiring layer 44 and the polycrystalline wiring layer 13 are maintained to +5 volts, respectively. On the other hand, the current is never obtained in the ROM memory cell 90 because the wiring layer 44 is not electrically connected to the drain region 12.

The phosphorus glass is formed as the first insulating film 41 on the drain and source regions 12, 18, 18' and on the gate electrode 13, when the impurities of the opposite conductivity type are diffused into the substrate and the polycrystalline silicon film 13 at the temperature of, for example, 950° C. and are driven in at the temperature of, for example, 1000° C. for forming the source and drain regions. If the impurities are introduced into the substrate for forming the source and drain regions and into the silicon film for changing the non-doped polycrystalline silicon film into a doped film by an ion-injection method, the phosphorus glass may be formed as the first insulating film by a CVD process after the impurity introducing process. The first insulating film consisting of phosphorus glass, has a high etching speed, for example, of 1 $\mu$/min. The second insulating film, consisting of CVD $SiO_2$, has low etching speed, for example, of 3000 Å/min. Therefore, the first aperture has a favorably larger size $S\times S$ than the second aperture's $t\times t$ for preventing overhanging structure at the contact portion.

Figure 6A:
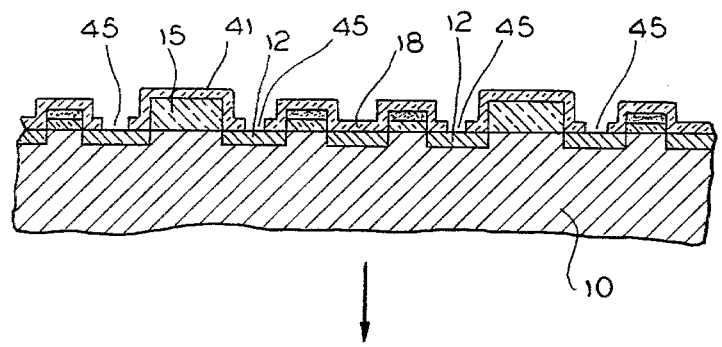
FIGS. 6A, 6B and 6C are cross-sectional views showing a sequence of steps in the process for producing a ROM according to one preferred embodiment of the present invention.
Figure 6B:
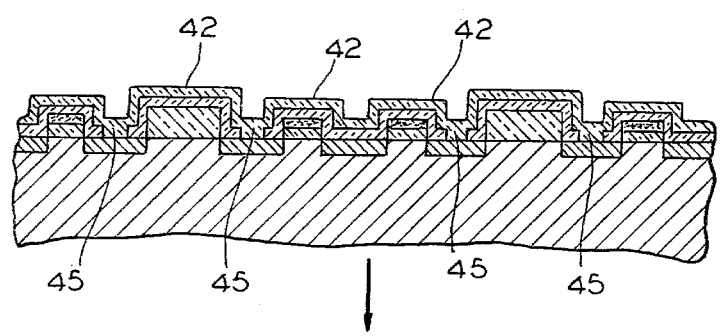
Figure 6C:
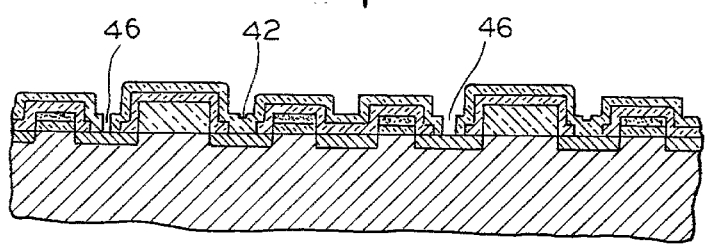

Production of the ROM according to the above-described embodiment is carried out through the sequential steps illustrated in FIGS. 6A, 6B and 6C. More particularly, first contact apertures are opened through the portions of the first insulating film 41 of phosphorus glass over all the drain regions 12 (FIG. 6A). Then, a CVD silicon oxide film is deposited over the entire surface by a conventional method, for example, from silane $SiH_4$ with a hydrogen carrier at about 700° C. This oxide film is made denser during a heat treatment for 20 minutes within a steam atmosphere at 900° C. (FIG. 6B). The semiconductor chips are placed in stock under such condition.

Subsequently, to customize the stock chips second contact apertures 46 are opened, but only through the second insulating film 42 within predetermined first contact apertures 45 designated by a customer's order codes (FIG. 6C). Then, the aluminum wirings 44 (FIG. 4B) are connected to the predetermined drain regions 12 through the second contact apertures 46 (wiring 44 is not shown in FIG. 6C). Therefore, the period from a reception of an order to the delivery of products can be shortened.

Figure 5A:
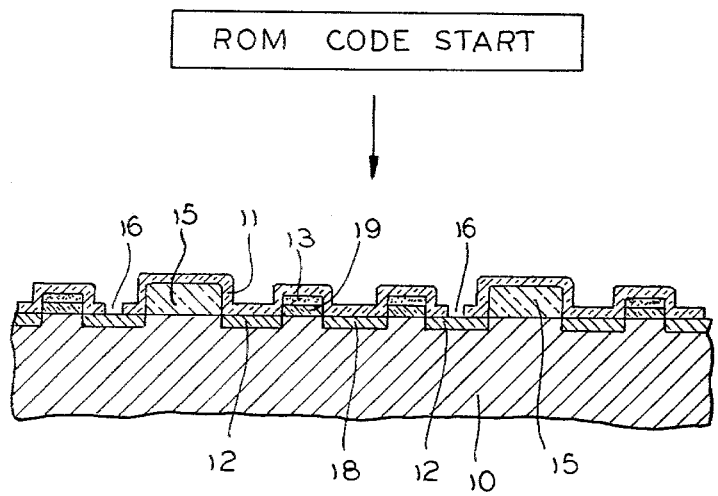
FIGS. 5A and 5B are cross-sectional views showing a sequence of steps in one process for producing a ROM in the prior art.
Figure 5B:
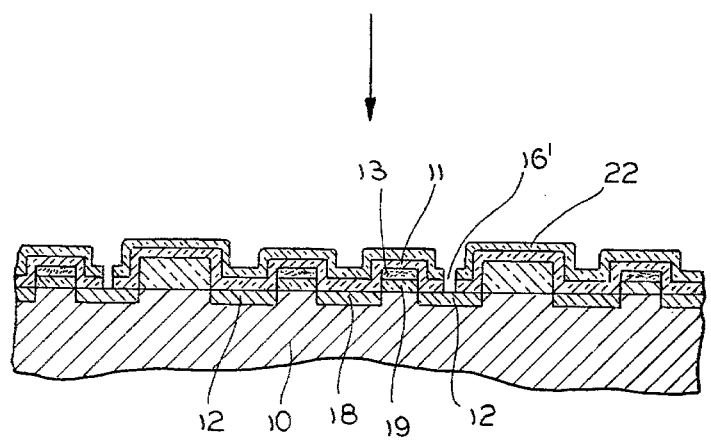

Contrast this with the prior method for producing ROM's as illustrated in FIGS. 5A and 5B. In response to the customer's order codes, contact apertures 16 are selectively opened (FIG. 5A). A silicon oxide film 22 is deposited over the entire surface and then contact apertures 16' are opened by means of the same mask code that is used for the contact apertures 16 (FIG. 5B), and thereafter aluminum wiring are applied. Therefore the period from reception of the customer's order and delivery of the products is prolonged.

As described above, the ROM's, according to the present invention, can be stocked under the condition where all of the possible contact apertures are opened by means of a first contact mask, that is common to every code. Then, a vapor-grown silicon oxide film is formed over the entire surface. The present invention yields various advantages such that after the receipt of an order for ROM codes, only an opening of code required contact apertures is necessary. Thus, the period after a reception of an order and before the delivery of products can be greatly shortened. The humidity resistance of the ROM's is very excellent because phosphorus glass and aluminum wirings make no direct contact with each other. Since the distance between the polysilicon wiring and the aluminum wiring, at their cross-point, is also increased by the thickness of the vapor-grown silicon oxide film, the capacitance between these wirings is reduced so that the interaction between the potential on the polysilicon wiring and the potential on the aluminum wiring, that is, the so-called cross-talk is reduced, and thus the operation speed of the ROM can be increased.

While one preferred embodiment of the present invention has been described above in connection to an n-channel type MOSIC, it is a matter of course that the present invention is equally applicable to ROM's employing p-channel type MOS's or complementary type MOS's (CMOS). Also, while an explanation was made in connection with an example in which a vapor-grown silicon oxide film is laid on phosphorus glass, the silicon oxide film could also be grown, as by sputtering. While the heat treatment for making the silicon oxide film denser can be achieved within a steam atmosphere with the best yield, it could be carried out within different atmospheres such as $N_2$ atmosphere, dry $O_2$ atmosphere, etc. It is to be noted that, in case where the growing temperature of the silicon oxide film is high and at the stage of completion of the growth the film has been sufficiently dense, as a matter of course, the heat treatment for making the film denser is unnecessary. In addition, while as an example, a thickness of the vapor-grown silicon oxide film of, 5000 Å is contemplated, it is more effective to chose any arbitrary value in the range of 0.1 to 1.0μ depending upon the devices. Furthermore, the heat treatment for making the silicon oxide film denser is effective in the temperature range of 700° to 1100° C.

In addition, according to the present invention, the unfinished ROM's are stocked under the condition where the CVD silicon dioxide film is coated over the entire surface. Thus, the problem of the surface of the semiconductor substrate being contaminated can be eliminated. In the practical process for producing ROM's, the step illustrated in FIG. 6C according to the present invention normally takes a time of about 1.5 to 2 days. In the prior art process, it takes about 4.5 to 6 days from the start of ROM coding in response to the receipt of a customer's order through the steps shown in FIGS. 5A and 5B to the completion of the process. Hence, the delivery of products is delayed correspondingly.

We claim:

1. A method of manufacturing a read-only memory comprising the steps of: providing a semiconductor substrate of one conductivity type, said substrate having a thick field insulator formed selectively on a major surface thereof, and a plurality of impurity regions of the opposite conductivity type formed in the major surface thereof; forming a first insulating film on said thick field insulator and on the surface of said impurity regions; providing a plurality of first apertures in said first insulating film by means of a first mask to expose the surface portions of all of said impurity regions; forming a second insulating film on said first insulating film and within said first apertures to cover the exposed surface portions of said impurity regions; and providing second apertures in said second insulating film within only some selected ones of said first apertures by means of a second mask to expose the impurity regions in surface portions of only some selected first apertures.

2. A method of manufacturing a read-only memory of claim 1, in which said first insulating film includes a glass film, and said second insulating film includes a deposited silicon dioxide film.

3. A method of manufacturing a read-only memory comprising the steps of: providing a semiconductor substrate of one conductivity type having a thick field insulator formed selectively on a major surface thereof; forming a plurality of impurity regions of the opposite conductivity type in the major surface of said substrate; forming a glass film on the surface of said plurality of impurity regions; providing a plurality of first apertures in said glass film to expose a surface of each of said impurity regions; covering said first apertures with a silicon dioxide film, and selectively exposing the surfaces of only some selected ones of said impurity regions, the surfaces of unselected impurity regions remaining covered by said glass film.

4. A method of manufacturing a read-only memory comprising the steps of: providing a semiconductor substrate of one conductivity type, said substrate having a thick field insulator selectively formed on a major surface thereof, a plurality of source regions of the opposite conductivity type formed in the major surface and extending in one direction, a plurality of drain regions of the opposite conductivity type formed in the major surface and arranged in a matrix form, a plurality of channel regions positioned between each of said drain regions and each part of said source regions; a plurality of gate insulator films formed on said channel regions, and a plurality of gate electrodes extending in said one direction over said gate insulator films and over said thick field insulator; forming a first insulating film on said thick field insulator, on the surface of said source regions, and on the surface of said drain regions; providing a plurality of first apertures in said first insulating film by means of a first mask to expose the surface portions of all of said drain regions; forming a second insulating film to cover said first apertures; providing second apertures in said second insulating film within only some selected ones of said first apertures by means of a second mask to expose the surface portions of selected drain regions; and electrically connecting a wiring layer on to the exposed surface of only said selected drain regions.

5. A method of manufacturing a read-only memory comprising the steps of: providing a semiconductor substrate of one conductivity type, said substrate having a plurality of active regions abutting against a thick field insulator selectively formed on a major surface thereof, a plurality of channel regions positioned in said active regions, a plurality of gate insulators formed on said channel regions, and a plurality of gate electrodes made of polycrystalline silicon extending in one direction over said gate insulator films and over said thick field insulator; forming a plurality of source and drain regions of the opposite conductivity type in said active regions so that a plurality of memory cells are provided in a matrix form; forming a first insulating film over said source and drain regions, over said gate electrode and over said thick field insulator; providing a plurality of first apertures in said first insulating film by means of a first mask to expose the surface portions of all said drain regions; forming a second insulating film to cover said first apertures; providing second apertures in said second insulating film within selected ones of said first apertures by means of a second mask to expose the surface portions of selected drain regions, with the surface portions of non-selected drain regions being covered by said second insulating film; and forming a plurality of wiring layers on said second insulating film, electrically connected to said selected drain regions and extending in a direction perpendicular to said one direction.

* * * * *

UNITED STATES PATENT AND TRADEMARK OFFICE
CERTIFICATE OF CORRECTION

PATENT NO. : 4255210
DATED : March 10, 1981
INVENTOR(S) : Y. OKUYAMA and T. SUZUKI It is certified that error appears in the above—identified patent and that said Letters Patent is hereby corrected as shown below:

Col. 2, Line 65, "region" s/b/ --regions--

Col. 3, Line 7, after "above" delete ","

Col. 5, Line 8, after "between" insert --adjacent wiring regions 13 include--

Signed and Sealed this

Third Day of November 1981

[SEAL]

Attest:

GERALD J. MOSSINGHOFF

Attesting Officer        Commissioner of Patents and Trademarks